United States Patent [19]

Aitchison

[11] Patent Number: 5,928,426
[45] Date of Patent: Jul. 27, 1999

[54] METHOD AND APPARATUS FOR TREATING EXHAUST GASES FROM CVD, PECVD OR PLASMA ETCH REACTORS

[75] Inventor: Kenneth Allen Aitchison, Los Gatos, Calif.

[73] Assignee: Novellus Systems, Inc., San Jose, Calif.

[21] Appl. No.: 08/694,353

[22] Filed: Aug. 8, 1996

[51] Int. Cl.⁶ .................................................. L23C 16/00
[52] U.S. Cl. .................. 118/715; 118/724; 55/385.1; 55/385.2; 55/434.4; 55/440; 55/442; 55/443; 156/345
[58] Field of Search .................... 118/715, 724; 55/385.1, 385.2, 434.4, 440, 442, 443; 438/905; 156/345

[56] References Cited

U.S. PATENT DOCUMENTS

| | | | |
|---|---|---|---|
| 4,335,574 | 6/1982 | Sato et al. | 60/311 |
| 4,556,384 | 12/1985 | Sarkozy | 427/54.1 |
| 4,608,063 | 8/1986 | Kurokawa | 55/208 |
| 4,735,633 | 4/1988 | Chiu | 55/2 |
| 4,940,213 | 7/1990 | Ohmine et al. | 266/152 |
| 5,063,737 | 11/1991 | Lopez-Crevillen et al. | 60/286 |
| 5,114,683 | 5/1992 | Hirase | 422/173 |
| 5,151,395 | 9/1992 | Tom | 502/67 |
| 5,213,767 | 5/1993 | Smith et al. | 422/177 |
| 5,303,558 | 4/1994 | Caton et al. | 62/55.5 |
| 5,362,461 | 11/1994 | Ohmi et al. | 423/163 |
| 5,417,934 | 5/1995 | Smith et al. | 422/177 |
| 5,422,081 | 6/1995 | Miyagi et al. | 422/170 |
| 5,468,459 | 11/1995 | Tamhankar et al. | 423/240 S |
| 5,738,908 | 4/1998 | Rey et al. | 427/249 |
| 5,782,942 | 7/1998 | Wu | 55/312 |

FOREIGN PATENT DOCUMENTS

| | | | |
|---|---|---|---|
| 0 382 984 A1 | 8/1990 | European Pat. Off. | B01D 53/34 |
| 38 14 388 C1 | 3/1989 | Germany | C23C 16/44 |
| 43 19 118 A1 | 12/1994 | Germany | A62D 3/00 |
| 60-1827 | 1/1985 | Japan | 118/725 |
| 60-229333 | 11/1985 | Japan | 118/715 |
| 60-234313 | 11/1985 | Japan | 118/715 |
| 63-278518 | 11/1988 | Japan . | |
| 1-293120 | 11/1989 | Japan . | |
| 4-136175 | 5/1992 | Japan | 118/715 |
| 4-290525 | 10/1992 | Japan . | |
| 96 16720 | 6/1996 | WIPO | B01D 53/46 |

*Primary Examiner*—Bruce Breneman
*Assistant Examiner*—Jeffrie R Lund
*Attorney, Agent, or Firm*—Skjerven, Morrill, MacPherson, Franklin and Friel; David E. Steuber; Roberta P. Saxon

[57] ABSTRACT

A method and apparatus for removing gas species which can be deposited thermally from a semiconductor process exhaust gas is provided. To treat the exhaust gas, an exhaust gas reactor comprising an artificial substrate which is heated is used. The artificial substrate is a structure upon which high temperature chemical vapor deposition (HTCVD) reaction product is deposited. In particular, the HTCVD reaction product is deposited by contacting the exhaust gas with the heated artificial substrate.

51 Claims, 8 Drawing Sheets

METHOD AND APPARATUS FOR TREATING EXHAUST GASES FROM CVD, PECVD OR PLASMA ETCH REACTORS

FIELD OF THE INVENTION

The present invention relates generally to chemical vapor deposition (CVD), plasma enhanced CVD and plasma etch processes. In particular, the present invention relates to a method and apparatus for treating the exhaust gases from such processes.

BACKGROUND OF THE INVENTION

CVD, PECVD and plasma etch processes (sometimes referred to herein as "semiconductor processes") use large amounts of a variety of process gases. The process gases used are often toxic, flammable and corrosive. Typically, only a small fraction of the process gases are consumed during the semiconductor process. As a result, the exhaust gas from the semiconductor process (which typically is a gas mixture) typically contains a substantial amount of unreacted process gases. To protect human health and the environment, as well as to comply with various emission restrictions, the exhaust gas from CVD, PECVD or other processes is treated to remove toxic and hazardous gas species before the exhaust gas is released to the atmosphere.

A number of methods are used to treat semiconductor process exhaust gas, each having a number of drawbacks. One common method is to combust the exhaust gas by burning the exhaust gas with fuel and air. However, fine particulates (dust) are produced as a byproduct of the combustion. Typically, the dust itself presents an environmental hazard and care must be exercised in collection of the dust. Frequently, the dust is collected by water scrubbing and subsequently the scrubbing water is treated to remove the dust particles. Further, the dust particles often clog various jets and burners used in the combustion system which causes the combustion system to fail.

Another conventional method of treating semiconductor process exhaust gas is by wet scrubbing. Wet scrubbing entails reacting the exhaust gas with water which causes water soluble gas species to dissolve in the water. The water is then treated to remove the dissolved material. However, water treatment units are expensive to operate and maintain. Further, as water use restrictions become increasingly common, wet scrubbing techniques become increasingly less attractive.

In Smith et al., U.S. Pat. No. 5,417,934, a dry exhaust gas treatment method is disclosed. The method comprises introducing the exhaust gas into a heated silicon stage which contains silicon particulates partially coated with copper and then into a heated calcium oxide stage which contains calcium oxide.

The exhaust gas reacts with the coated silicon and the calcium oxide in the first and second stages, respectively, to form involatile compounds which remain in the first and second stages. However, since the coated silicon and the calcium oxide occupy a substantial volume, the remaining volume available for the involatile compounds formed from the reacted exhaust gas is limited. This limits the operating life of the exhaust gas treatment unit. Further, the active chemical components, i.e. the coated silicon and calcium oxide, are relatively expensive and the exhaust gas treatment unit is also relatively expensive.

In Chiu, U.S. Pat. No. 4,735,633, an exhaust gas treatment method which uses a plasma extraction reactor is disclosed. The plasma extraction reactor comprises a pair of parallel, spaced-apart electrodes which are driven at radio frequency to induce a glow discharge in the waste species. The excited species are deposited directly on the electrode surface.

Of importance, the plasma extraction reactor is located in the sub-atmospheric pressure region (the foreline) between the semiconductor processing chamber in which the semiconductor processing occurs and the vacuum pump which removes the exhaust gas from the semiconductor processing chamber. The plasma extraction reactor must operate at sub-atmospheric pressure to effectively generate the plasma which causes the excited exhaust gas species to be deposited. During the required periodic servicing and replacement of the plasma extraction reactor, the foreline must be vented to atmospheric pressure. This necessitates removing the semiconductor processing chamber from service, which is undesirable. Further, the power supplies used to power the plasma extraction reactor, as well as the air to vacuum electrical interconnection required to supply the power to the plasma extraction reactor, are relatively expensive to purchase, maintain and operate.

The art needs an exhaust gas treatment apparatus which is cost effective and operates well in its intended environment. In particular, it is desirable to avoid generating dust particles and to avoid dissolving exhaust gas species in water. Furthermore, it is desirable that the apparatus have an extended lifetime and that the semiconductor processing not be interrupted during the servicing and replacement of the apparatus.

SUMMARY OF THE INVENTION

In accordance with the present invention, a method and apparatus for treating exhaust gas from semiconductor processes is provided. In one embodiment, an exhaust gas reactor for treating exhaust gas comprises an artificial substrate which is heated. The artificial substrate is a structure upon which high temperature chemical vapor deposition (HTCVD) reaction product is deposited. The HTCVD reaction product is deposited by contacting the exhaust gas with the artificial substrate.

The artificial substrate can comprise a plurality of substantially parallel plates mounted in an outer housing which has an inlet port and an outlet port. In one embodiment, the plurality of substantially parallel plates comprises a plurality of short plates spaced between a plurality of long plates. By locating the short plates near the outlet port of the outer housing, the surface area of the artificial substrate is increased where the concentration of active gas species (gas species which can be deposited thermally) is relatively low. This improves the efficiency of the exhaust gas reactor in removing the active gas species from the exhaust gas.

The artificial substrate can be heated using a variety of techniques. The artificial substrate can be heated indirectly by heating the outside surface of the outer housing. Alternatively, the artificial substrate can be heated directly by inductively coupling radio frequency or microwave radiation to the artificial substrate, by passing an electrical current through the artificial substrate, or by locating a resistive heating element in the artificial substrate. The artificial substrate temperature can be measured, for example by using one or more thermocouples.

In one embodiment, the artificial substrate comprises a first tube and a plurality of plates radiating from the first tube to a second tube. In this embodiment, the artificial substrate can be heated by locating a resistive heating element in the first tube.

To cool the exhaust gas, an exhaust gas cooler can be located downstream of the exhaust gas reactor. Alternatively, a portion of the outer housing located near the outlet port can be cooled.

To improve the efficiency of the exhaust gas reactor or to modify the chemical composition of the HTCVD reaction product deposited, supplemental process gases can be injected into the exhaust gas reactor and mixed with the exhaust gas in order to create deposits of binary, tertiary or higher elemental composition.

In one embodiment, the exhaust gas reactor is mounted in a substantially airtight cabinet which vents any exhaust gas which escapes from the exhaust gas reactor to the atmosphere.

A control system is used to control the operation of the exhaust gas reactor. The control system monitors and maintains the temperature of the exhaust gas reactor. Further, the control system can monitor the pressure at various locations in the exhaust gas reactor and divert the exhaust gas, for example directly to the atmosphere, when the flow of exhaust gas through the exhaust reactor becomes obstructed.

These and other objects, features and advantages of the present invention will be more readily apparent from the detailed description of the preferred embodiments set forth below taken in conjunction with the accompanying drawings.

DESCRIPTION OF THE PREFERRED EMBODIMENTS

In accordance with the present invention, a method and apparatus for treating exhaust gas from semiconductor processes is provided. The method uses high temperature chemical vapor deposition (HTCVD) to deposit dense, adherent coatings on artificial substrates. As used herein, artificial substrate refers to a structure upon which HTCVD reaction product from an exhaust gas is deposited.

Several elements shown in the following figures are substantially similar. Therefore, similar reference numbers are used to represent similar elements.

Figure 1:
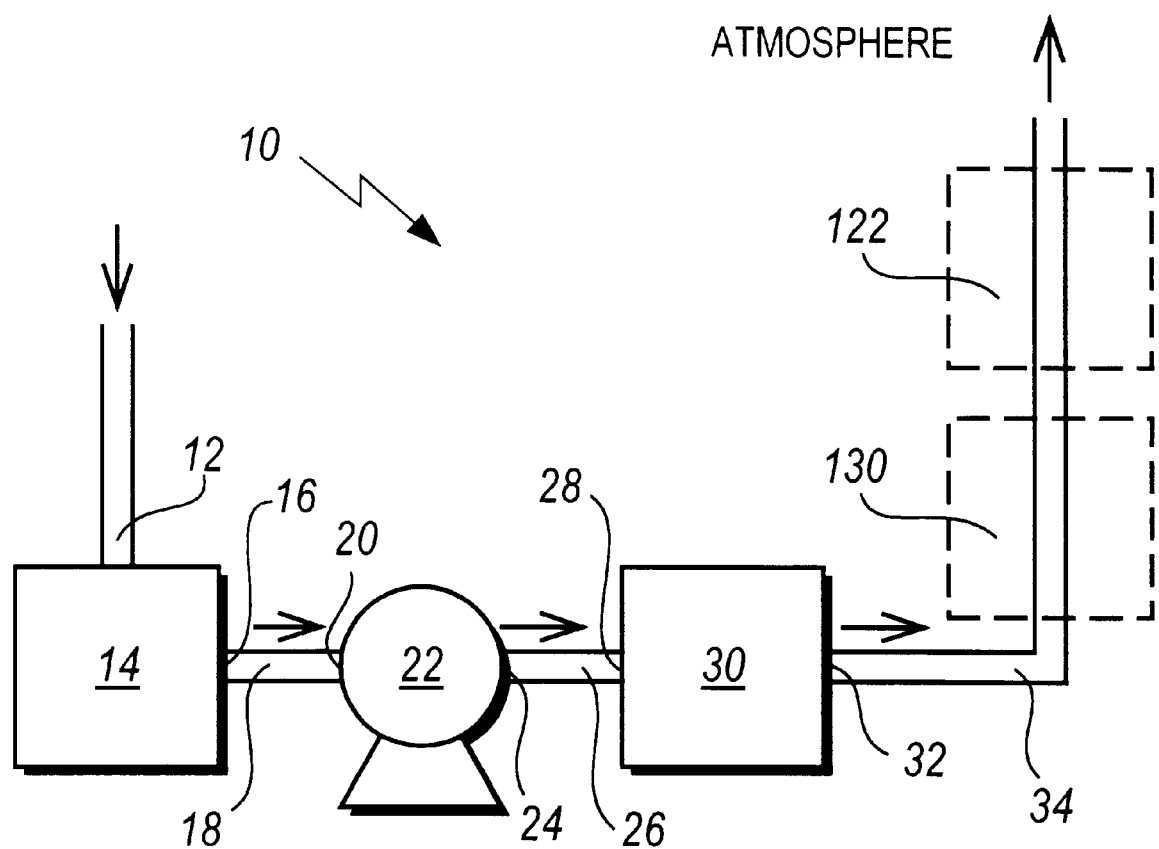
FIG. 1 is a schematic view of a semiconductor processing system utilizing an exhaust gas reactor in accordance with one embodiment of the present invention.

FIG. 1 is a schematic view of a semiconductor processing system 10 utilizing an exhaust gas reactor 30 (exhaust gas reactor is hereinafter referred to as EGR) in accordance with one embodiment of the present invention. As shown in FIG. 1, a semiconductor processing chamber 14 has a process gas manifold 12. Semiconductor processing chamber 14 is typically a plasma enhanced chemical vapor deposition (PECVD) chamber, a chemical vapor deposition (CVD) chamber or a plasma etch chamber. Process gas manifold 12 typically comprises a plurality of gas inlets which allow a plurality of process gases to be mixed and introduced simultaneously into chamber 14. An exhaust gas outlet port 16 from chamber 14 is coupled to an inlet port 20 of a vacuum pump 22 by a conduit or pipe 18. An outlet port 24 of vacuum pump 22 is coupled to an inlet port 28 of EGR 30 by a conduit or pipe 26. An outlet port 32 from EGR 30 is vented to atmosphere by a conduit or pipe 34. The arrows in FIG. 1 indicate the direction of forward-flow of the process and exhaust gases. As used in this application, downstream refers to the direction indicated by the arrows and upstream refers to the direction opposite the arrows.

During use, chamber 14 is pumped down to a sub-atmospheric pressure by vacuum pump 22. Process gas is introduced into chamber 14 through manifold 12. Exhaust gas (typically a gas mixture comprising unreacted process gases and gases produced as a byproduct of the semiconductor process) exits chamber 14 through outlet port 16. The exhaust gas travels through conduit 18 to inlet port 20 of pump 22.

Pump 22 compresses the exhaust gas, which is at sub-atmospheric pressure at inlet port 20, to greater than or equal to atmospheric pressure and discharges the compressed exhaust gas at outlet port 24. The exhaust gas, which is now at or about atmospheric pressure, travels from outlet port 24 through conduit 26 to inlet port 28 of EGR 30, which treats the exhaust gas as described in detail below. The treated exhaust gas is then discharged from EGR 30 at outlet port 32 to the atmosphere through conduit 34.

Figure 2:
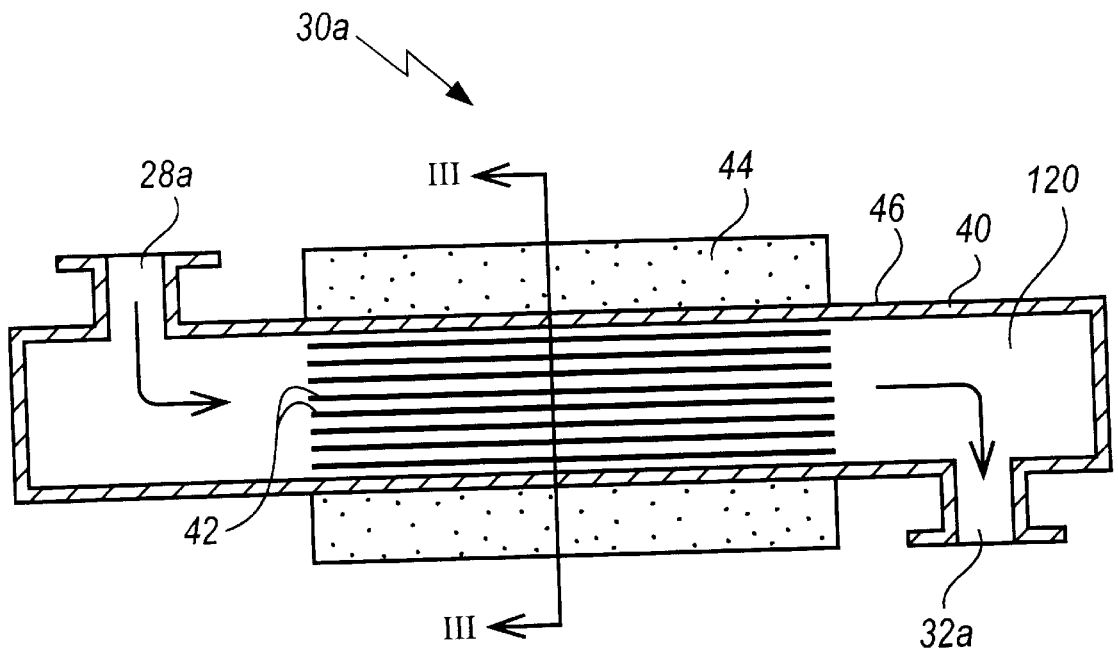
FIG. 2 is a cross-sectional view of an exhaust gas reactor in accordance with one embodiment of the present invention.

FIG. 2 is a cross-sectional view of an EGR 30a in accordance with one embodiment of the present invention. EGR 30a includes an outer housing 40, typically a sealed metal tube. Outer housing 40 includes gas inlet port 28a and gas outlet port 32a through which exhaust gas enters and exits EGR 30a, respectively. Located within outer housing 40 is a plurality of plates 42 which form the artificial substrate for the HTCVD exhaust gas reaction described below. As shown, plates 42 are substantially parallel with one another. Located on the outside surface 46 of outer housing 40 is an electrically heated jacket 44.

Figure 3:
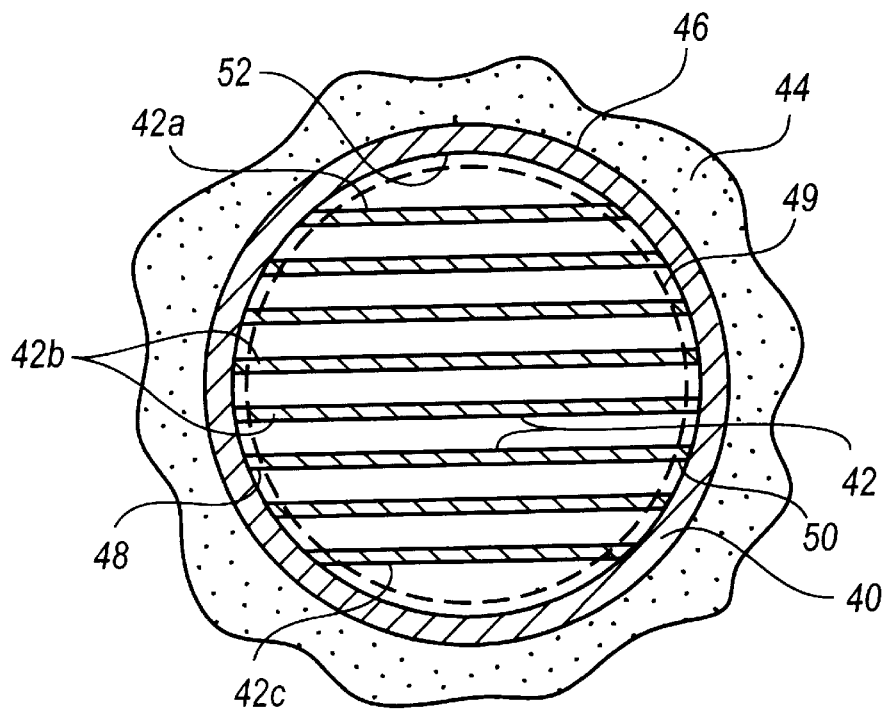
FIG. 3 is a cross-sectional view taken along the line III—III of the exhaust gas reactor shown in FIG. 2.

FIG. 3 is a cross-sectional view of EGR 30a taken on the line III—III shown in FIG. 2. As shown in FIG. 3, a first end 48 and a second end 50 of each plate 42 is in contact with the inner surface 52 of outer housing 40. Furthermore, each plate 42 has a various width (the distance between first end 48 and second end 50) which depends upon the location of the plate within outer housing 40. In particular, upper and lower plates 42a, 42c located at the top and bottom, respectively, of outer housing 40 have the smallest width.

Center plates 42b, located near the center of outer housing 40, have the largest width. The widths of plates 42 increase from upper plate 42a (and lower plate 42c) to center plates 42b. Plates 42 can be tack-welded to an inner sleeve that has a diameter slightly less than the inner diameter of the metal tube.

During use, jacket 44 heats the outer surface 46 of outer housing 40. Heat is conducted from outer surface 46 to inner surface 52 of outer housing 40. The heat is then conducted to first and second ends 48, 50 and to plates 42. As a result, outer housing 40 and plates 42 are heated to an elevated temperature.

Exhaust gas is then introduced into EGR 30a. As best seen in FIG. 2, exhaust gas enters gas inlet port 28a, flows through the spaces between plates 42 and exits at outlet port 32a. The arrows in FIG. 2 indicate the direction of forward flow of the exhaust gas. In particular, as the exhaust gas flows between plates 42, the exhaust gas contacts the heated surfaces of plates 42. As a result of contacting the heated surfaces of plates 42, a HTCVD reaction occurs which forms an involatile reaction product which adheres to the heated surfaces of plates 42. Generally, any exhaust gas which contains gas species which can be deposited thermally can be treated (these gas species are hereinafter referred to as active gas species).

For example, the exhaust gas from a typical tungsten CVD process contains gaseous tungsten hexafluoride ($WF_6$) and hydrogen ($H_2$). When the $WF_6$ and $H_2$ contact the heated surfaces of plates 42, an HTCVD reaction occurs which deposits tungsten on the heated surfaces of plates 42. To effectively promote the $WF_6$ HTCVD reaction, plates 42 are generally heated to at least 350° C., and preferably to at least 500° C.

Generally, to promote the HTCVD reaction with the exhaust gas, the surface area upon which the HTCVD reaction occurs is maximized for any given EGR volume. In particular, by arranging several plates 42 instead of a single plate inside of outer housing 40 as shown in FIGS. 2 and 3, the surface area of plates 42 within outer housing 40 is increased from that of a single plate. By increasing the surface area of plates 42 within outer housing 40, the area available for contact with the exhaust gas is correspondingly increased. By providing a large surface area upon which the HTCVD reaction occurs, the HTCVD reaction is promoted. This in turn promotes the efficiency of EGR 30a, i.e. promotes the complete removal of active gas species from the exhaust gas.

To further promote the HTCVD reaction, the temperature of plates 42 is maintained above the minimum temperature required to initiate the HTCVD reaction. In particular, the plates are preferably heated such that if there is any non-uniformity in temperature across the plates, the minimum plate temperature is greater than the minimum temperature required to initiate the HTCVD reaction. This is accomplished by setting the temperature of jacket 44 above the minimum temperature required to initiate the HTCVD reaction. As discussed above, to effectively treat exhaust gas containing $WF_6$, plates 42 must generally be heated to a minimum temperature greater than 350° C. Therefore, when treating exhaust gas containing $WF_6$, the temperature of jacket 44 should be set above 350° C. and in one embodiment is set at 550° C.

Figure 4:
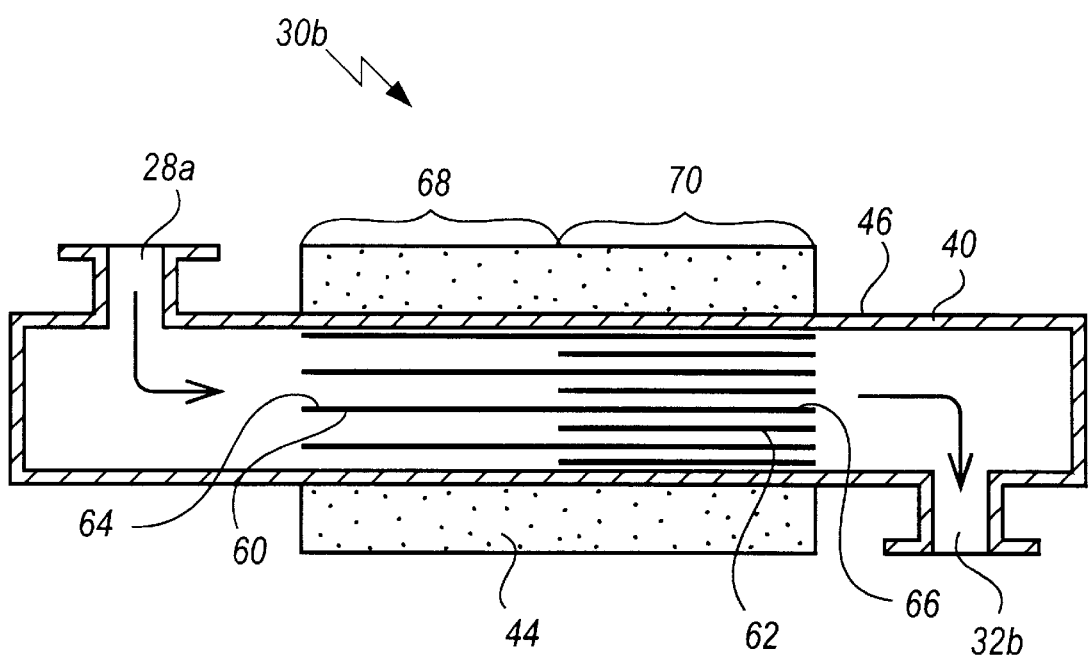
FIG. 4 is a cross-sectional view of an exhaust gas reactor in accordance with another embodiment of the present invention.

FIG. 4 is a cross-sectional view of an EGR 30b in accordance with another embodiment of the present invention. FIG. 4 is substantially similar to FIG. 2 except for the arrangement of the plates within outer housing 40. As shown in FIG. 4, the plates contained within outer housing 40 comprise long plates 60 and short plates 62. Long plates 60 are substantially similar to plates 42 in EGR 30a (FIG. 2) and extend across a substantial length of EGR 30b. However, located between each long plate 60 is a short plate 62. In one embodiment, the length of short plates 62 is one-half the length of long plates 60.

During use, exhaust gas flows between plates 60, 62 from inlet port 28a to outlet port 32a. The concentration of active gas species in the exhaust gas is highest at first ends 64 of long plates 60. As the exhaust gas travels along plates 60, 62, the active gas species are removed from the exhaust gas and involatile HTCVD reaction product is deposited on plates 60, 62. As a result, the concentration of active gas species in the exhaust gas is the lowest (if not zero) at second ends 66 of long plates 60.

By locating short plates 62 in a region 70 near outlet port 32b, the surface area available for the HTCVD reaction in region 70 is increased. (In this embodiment, where one short plate 62 is located between each long plate 60, the surface area available for the HTCVD reaction in region 70 is approximately doubled as compared to a region 68 where there are no short plates 62.) This advantageously increases the surface area in region 70 where the concentration of active gas species is relatively low, thereby improving the efficiency of EGR 30b, i.e. thereby improving the percentage removal of active gas species from the exhaust gas.

Conversely, in region 68 near inlet port 28a where the concentration of active gas species is relatively high, the spacing between plates 64 is increased as compared to the plate spacing in region 70. The rate at which HTCVD reaction product is deposited is higher when the active gas species concentration is higher. As a result, the tendency of HTCVD reaction product to deposit and obstruct the flow of exhaust gas is greatest at first ends 64 of long plates 60. The increased plate spacing in region 68 allows more HTCVD reaction product to be deposited in region 68 before the exhaust gas flow is obstructed. This extends the amount of time which EGR 30b can be used before the flow of exhaust gas through EGR 30b is obstructed.

Figure 5:
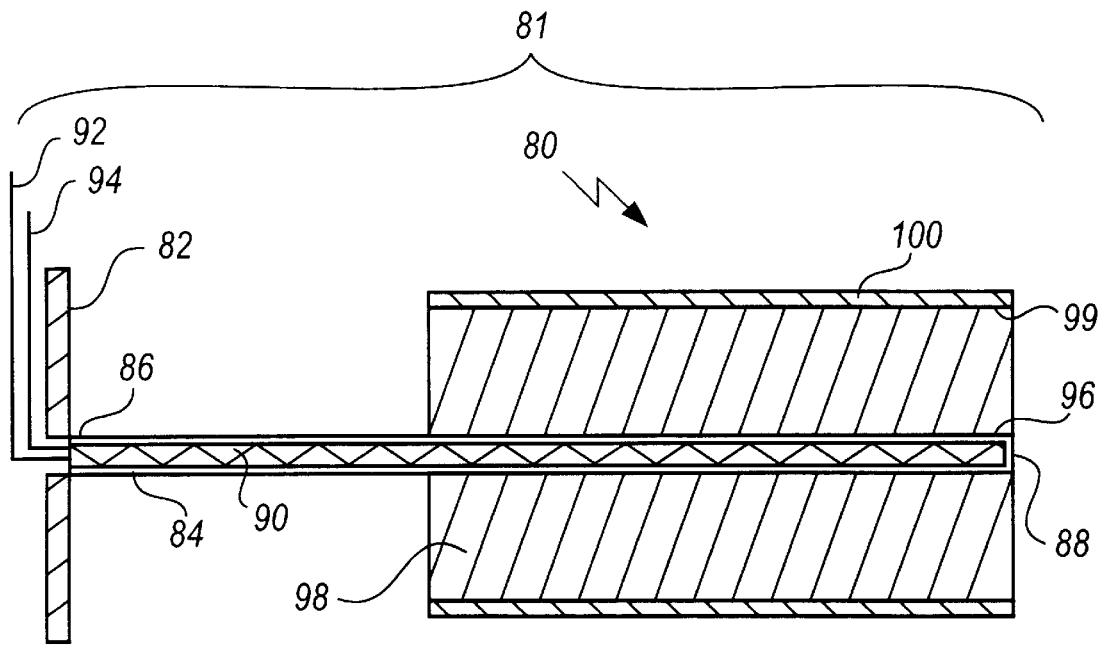
FIG. 5 is a cross-sectional view of a removable exhaust gas reactor unit for use in an exhaust gas reactor in accordance with the preferred embodiment of the present invention.

FIG. 5 is a cross-sectional view of a removable EGR unit 81 which includes an artificial substrate 80 mounted to a face plate 82 for use in an EGR in accordance with the preferred embodiment of the present invention. Artificial substrate 80 includes an inner tube 84 which is attached or welded on a first end 86 to face plate 82. Face plate 82 has an opening formed therein to provide access to the inside of inner tube 84. The second end 88 of inner tube 84 is sealed. Located within inner tube 84 is a resistive heating element 90. Resistive heating element 90 has first and second leads 92, 94 which are connected to a source of voltage (not shown). Attached to a portion of inner tube 84 adjacent second end 88 are first ends 96 of plates 98. As further described below, plates 98 radiate outward from inner tube 84 to an outer tube 100. Plates 98 are attached on a second end 99 to outer tube 100.

Figure 6:
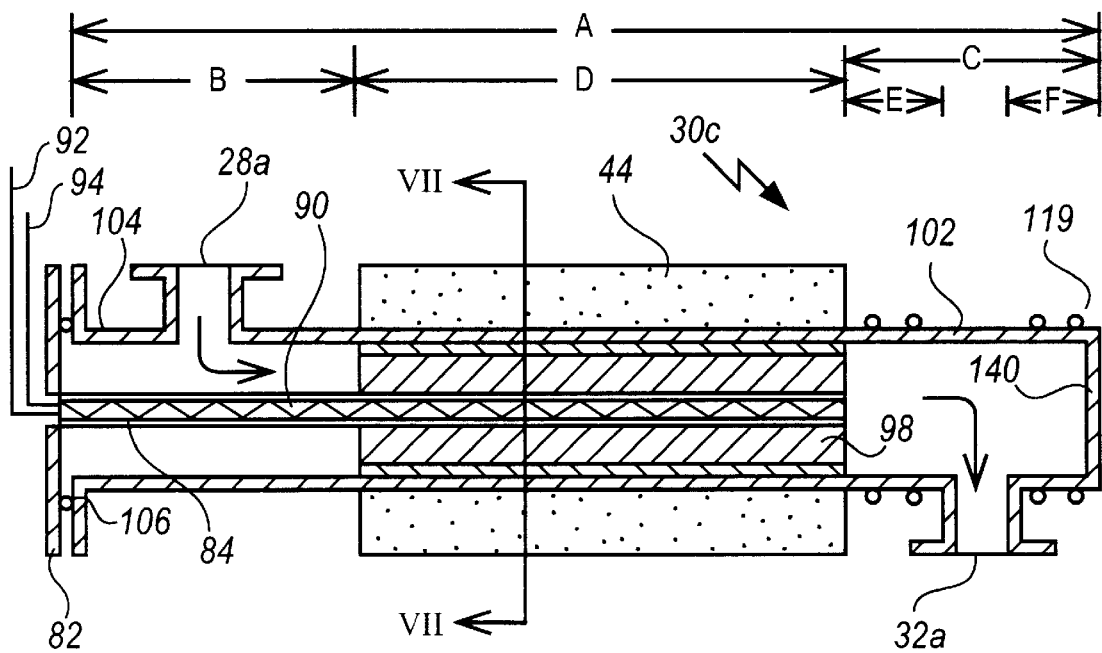
FIG. 6 is a cross-sectional view of an exhaust gas reactor which includes the removable exhaust gas reactor unit of FIG. 5.

FIG. 6 is a cross-sectional view of an EGR 30c which includes removable EGR unit 81 in accordance with this embodiment of the present invention. In this embodiment, an outer housing 102 has a flanged first end 104. Flanged first end 104 allows removable EGR unit 81 to be readily installed and removed.

To install removable EGR unit 81 into outer housing 102, second end 88 of inner tube 84 along with plates 98 and outer tube 100 are inserted into flanged first end 104. Removable EGR unit 81 is then slid into outer housing 102 until face plate 82 contacts flanged first end 104. An O-ring 106 is located between face plate 82 and flange first end 104 to create a vacuum seal between face plate 82 and flanged first end 104. To make installation and removal of removable EGR unit 81 easier, handles can be mounted to the outer surface of face plate 82.

In one embodiment, the length A from first end 104 to a second end 140 of EGR 30c is 40 inches. Inlet port 28a and outlet port 32a are two inches in diameter. The length B from first end 104 to plates 98 is six inches. The length D of plates 98 is twenty four inches. The length E from plates 98 to outlet port 32a is two inches. The length C from plates 98 to second end 140 is ten inches and the length F from outlet port 32a to second end 140 is six inches.

Figure 7:
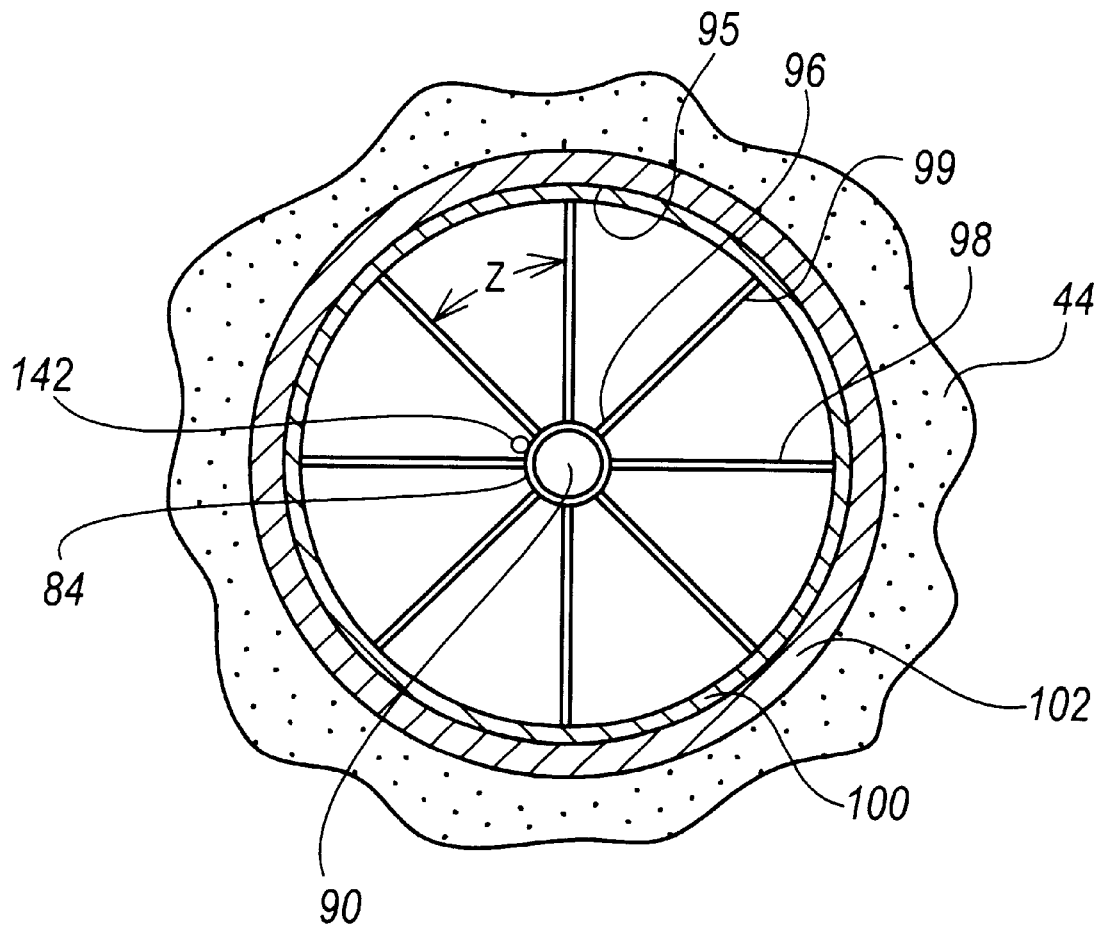
FIG. 7 is a cross-sectional view taken along the line VII—VII of the exhaust gas reactor of FIG. 6.

FIG. 7 is a cross-sectional view of EGR 30c along the line VII—VII of FIG. 6 in accordance with this embodiment of the present invention. As shown in FIG. 7, inner tube 84 has enclosed therein resistive heating element 90. Plates 98 radiate outward from inner tube 84 to outer tube 100. In particular, each plate 98 is connected on first end 96 to inner tube 84 and on second end 99 to outer tube 100. Generally, at least two plates 98 are used. In one embodiment, plates 98 are located at 15° increments, i.e. the angle Z in FIG. 7 between adjacent plates 98 equals 15°.

Also shown in FIG. 7 is an optional third tube 142 in which one or more thermocouples can be located. Tube 142 is mounted to the outer surface of inner tube 84 and in one embodiment extends the length of inner tube 84. One end of tube 142 (not shown), adjacent second end 88 of inner tube 84, is sealed. The second end of tube 142 (not shown) is mounted to face plate 82. To allow access to the inside of tube 142, face plate 82 has a second hole which coincides with tube 142. It is understood that tubes 84, 142 are mounted to face plate 82 such that during use of EGR 30c, the inside of tubes 84, 142 are isolated from exhaust gas located within EGR 30c. Thus, thermocouples can be located at, and the temperature can be measured at, various positions along the length of EGR 30c by the thermocouples located inside of tube 142.

To allow outer tube 100 to fit into outer housing 102, the outer diameter of outer tube 100 is less than the inner diameter of outer housing 102. To maximize conductive heat transfer from jacket 44, through outer housing 102 and to outer tube 100, the outer diameter of outer tube 100 should be such that outer tube 100 fits snugly into outer housing 102. Typically, outer housing 102 has an inside diameter of four inches and the difference between the inside diameter of outside housing 102 and the outer diameter of outer tube 100 is less than six millimeters (mm).

During use, heat generated by resistive heating element 90 is conducted through inner tube 84 to first ends 96 of plates 98, and ultimately to plates 98. Heat generated by jacket 44 is conducted through outer housing 102 and heats outer tube 100, second ends 99 of plates 98, and ultimately plates 98. By heating plates 98 from first ends 96 with resistive heating element 90 and from second ends 99 with jacket 44, non-uniformity in the temperature distribution of plates 98 is reduced as compared to the single jacket heated EGRs 30a, 30b shown in FIGS. 2, 3 and 4. However, in one embodiment, EGR 30c is heated using only jacket 44, or alternatively, only resistive heating element 90.

Referring again to FIG. 6, exhaust gas containing active gas species enters inlet port 28a, flows between plates 98 and exits through outlet port 32a. As the exhaust gas contacts plates 98, the outside surface of inner tube 84, and the inside surface of outer tube 100, the active gas species are removed from the exhaust gas, and involatile HTCVD reaction product is deposited on plates 98 and tubes 84 and 100. The use of removable EGR unit 81 advantageously improves the serviceability of EGR 30c since the amount of material deposited directly on outer housing 102 is reduced. (During servicing of EGR 30c, removable EGR unit 81 is removed, any deposits on inner surface 95 of outer housing 102 are removed and a new removable EGR unit 81 is installed. Alternatively, removable EGR unit 81 is stripped of HTCVD reaction product and the same removable EGR unit is installed.)

This is in contrast to EGRs 30a, 30b shown in FIGS. 2, 3 and 4 in which HTCVD reaction product deposited directly on outer housing 40 (which is heated) is typically removed during servicing. In alternative embodiments, plates 42 and 60, 62 in EGRs 30a, 30b, respectively, are encased in a second tube 49 (indicated by the dashed line in FIG. 3) similar to second outer tube 100 (FIGS. 5, 6 and 7), thereby reducing the amount of HTCVD reaction product deposited directly on inner surface 52 of outer housing 40 (FIG. 2, 3 and 4).

In an alternative embodiment, the EGR is mounted in a vertical position such that face plate 82 is directed upward. In this embodiment, deposits which form on the plates and other inner surfaces of the EGR may be knocked off by some mechanical means at predetermined intervals. Gravity will drive the particles of deposit downward to plate 140. A flange connection may be substituted for plate 140, and connection can be made to a container for retaining this accumulated material. Alternatively, as the deposit builds up on the plates and inner surfaces of the EGR, stresses in this deposited material may result in a loss of adhesion, and the coating of deposited material may spontaneously fall off, thereby cleaning the surfaces. If necessary, an automated means of periodically pushing these solids down may be provided.

The temperature distribution of various EGRs in accordance with the present invention were modeled, and the results are shown in the table below. EGR A is similar to EGR 30a (FIG. 3) in which first and second ends 48, 50 of plates 42 are assumed to be attached to the inner surface 52 of outer housing 40. EGR B is similar to EGR 30a (FIG. 3) with the exception that first and second ends 48, 50 of plates 42 are assumed to be ¼ inch from inner surface 52 of outer housing 40. EGR C is similar to reactor 30a (FIG. 3) with the exception that plates 42 are assumed to be enclosed in second tube 49 (indicated by a dashed line 49 in FIG. 3) and the average spacing between the outer surface of tube 49 and inner surface 52 of outer housing 40 is assumed to be 0.010 inches. EGR D is similar to EGR 30c (FIG. 7) wherein the angle Z between plates is assumed to be 15° and the average spacing between the outer surface of outer tube 100 and the inner surface 95 of outer housing 102 is assumed to be six millimeters.

In EGRs A, B and C, it is assumed that there are eight plates 42 and the spacing between plates 42 is 1 centimeter (cm). In all of the EGRs A, B, C and D, the following assumptions are made. The plates are 1/16 inch thick stainless steel plates. Outer housing (40, 102 in FIGS. 3, 7, respectively) has an outer diameter of four inches and is 36 inches in length (which is defined as the length from inlet port 28a to outlet port 32a). The length of the plates (42, 98 in FIGS. 2, 6, respectively) is 24 inches. Heater jacket 44 is also 24 inches in length and is positioned laterally to correspond with the plates. Heater jacket 44 is heated to 550°. Further, in reactor D, it is assumed that the internal resistive heating element 90 is also heated to 550° C.

EGRs A, B, C and D were modeled for an exhaust gas stream as follows:

Inlet temperature 100° C.

Pressure 760 torr $WF_6$ gas flow 400 sccm hydrogen ($H_2$) flow 18,000 sccm silane ($SiH_4$) flow 20 sccm argon (Ar) flow 21,000 sccm Total flow 39,420 sccm where sccm stands for standard cubic centimeters per minute and the inlet temperature is the temperature of the exhaust gas as it enters inlet port 28a. Radiative heat transfer and gas consumption were neglected in the temperature distribution modeling.

The results of the predicted average plate temperatures are provided in Table 1. In Table 1, for EGRs A, B and C, plates 1, 4 refer to plates 42a, 42b, respectively (FIG. 3) and plates 2 and 3 refer to the plates located in between plates 42a and 42b. For EGR D, plate 1 refers to any plate 98 since the symmetrical design of EGR D heats each plate substantially identically.

| Exhaust Gas | Average Plate Temperature ° C. | | | |
| --- | --- | --- | --- | --- |
| Reactor | Plate 1 | Plate 2 | Plate 3 | Plate 4 |
| A | 481 | 443 | 420 | 412 |
| B | 345 | 211 | 207 | 215 |
| C | 475 | 431 | 406 | 396 |
| D | >500 | | | |

As discussed above, to effectively remove $WF_6$ from the exhaust gas, the minimum plate temperature should generally be above 350° C. In EGR B, the average plate temperature for plates 1–4 is below 350° C. This is because heat is not readily conducted across the ¼ inch gap between the first and second ends 48, 50 and the inner surface 52 of outer housing 40. In EGRs A, C adequate temperature distribution is achieved. EGR D has the highest plate temperature (over 500° C.) primarily due to the addition of the resistive heating element 90 (FIG. 7).

Figure 8:
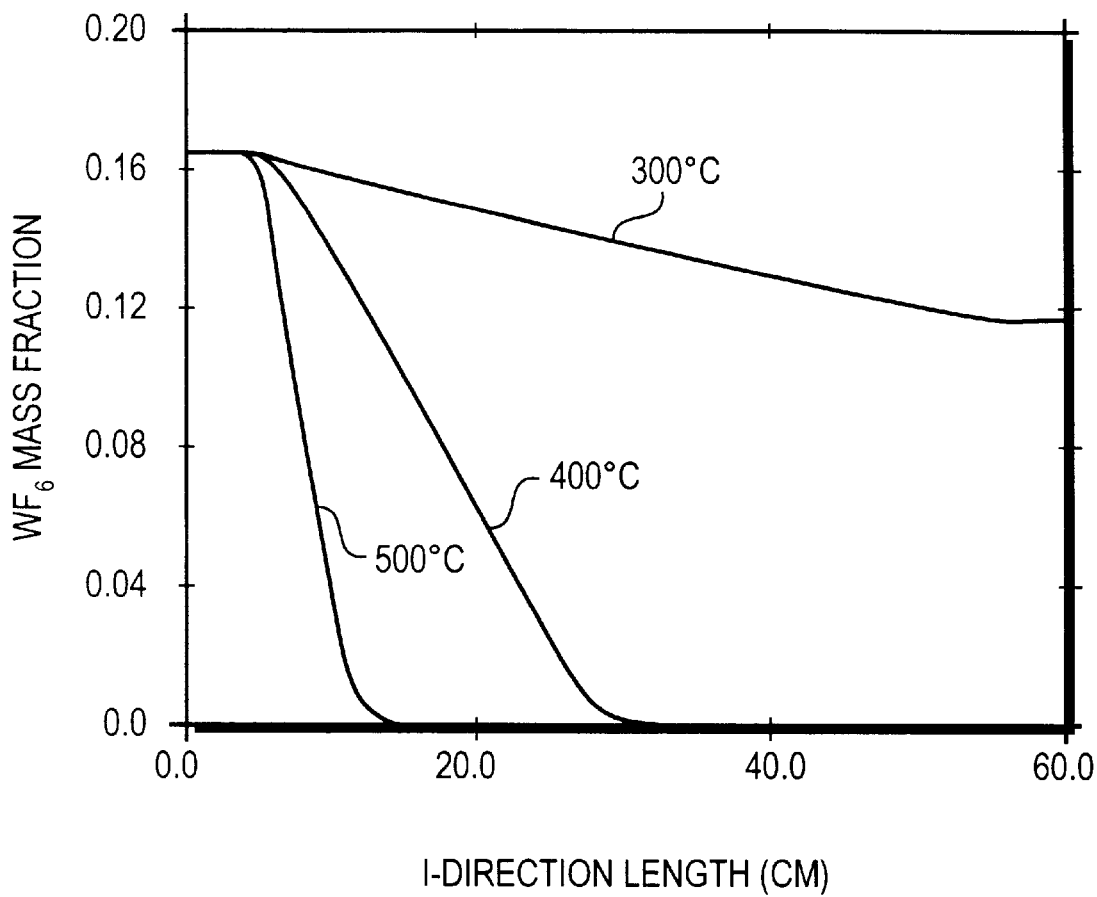
FIG. 8 is a graph of the mass fraction of tungsten hexafluoride ($WF_6$) in the exhaust gas versus position along the plates in an exhaust gas reactor in accordance with one embodiment of the present invention for plate temperatures of 300° C., 400° C. and 500° C.

For EGR A (parallel plate with plate spacing of 1 cm), the effect of plate temperature on the efficiency of removal of $WF_6$ was also modeled. The three curves of FIG. 8 show the mass fraction of $WF_6$ in the total flow versus position along plates 42 for plate temperatures of 300° C., 400° C. and 500° C., respectively. The exhaust gas inlet composition and conditions were substantially similar to those used in modeling the temperature distribution of EGRs A, B, C and D discussed above in reference to Table 1. In all three cases, the $WF_6$ mass fraction of the exhaust gas as it enters the inlet port 28a of the EGR is approximately 0.16.

The 300° C. curve represents the $WF_6$ mass fraction of the exhaust gas versus distance along the plates for a plate temperature of 300° C. As shown by the 300° C. curve, the $WF_6$ mass fraction of the exhaust gas decreases from approximately 0.16 as the exhaust gas enters the plates to approximately 0.12 as the exhaust gas exits the plates. However, it is generally desirable to remove all $WF_6$ from the exhaust gas.

The 400° C. curve represents the $WF_6$ mass fraction of the exhaust gas versus distance along the plates for a plate temperature of 400° C. As shown by the 400° C. curve, the $WF_6$ mass fraction decreases to zero at a distance of approximately 30 cm from the leading edge of the plates (the edge where the exhaust gas first encounters the plates). As such, at a plate temperature of 400° C., all $WF_6$ is removed from the exhaust gas.

The 500° C. curve represents the $WF_6$ mass fraction of the exhaust gas versus distance along the plates for a plate temperature of 500° C. As shown by the 500° C. curve, the $WF_6$ mass fraction decreases to zero at a distance of approximately 10 cm from the leading edge of the plates. However, since the $WF_6$ is removed within the first 10 cm of the plates, heavy tungsten (the HTCVD reaction product from $WF_6$) deposits occur in the first 10 cm of the plates with substantially no tungsten deposits occurring in the remaining 50 cm of the plates. However, it is desirable to distribute the tungsten deposits over the length of the plates to increase the amount of tungsten which can be deposited before the flow of exhaust gas is significantly restricted and thus increase the lifetime of the EGR. By lowering the temperature (as shown by the 400° C. curve), the tungsten deposits are distributed over a greater length of the plates.

In alternative embodiments, instead of using heating jacket to heat the outer housing, the outer housing is heated using heating tape or a tube furnace. Alternatively, the artificial substrate can be heated directly. For example, the artificial substrate can be located in an electrically insulating outer housing such as an outer housing made of quartz. Then, the artificial substrate is heated by inductively coupling radio frequency (RF) or microwave radiation to the artificial substrate. Alternatively, the artificial substrate is heated by passing an electric current through the artificial substrate.

Although flat plates are described in the above EGRs in accordance with the present invention, in other embodiments other artificial substrate configurations are used. For example, wavy or curved plates can be used. Plates with protrusions or apertures can be used. In one embodiment, the artificial substrate does not comprise plates, for example is a honeycomb mesh or is a series of strips. The artificial substrate may be formed of any metal, alloy, or other refractory inorganic material(s) that can withstand the thermal and chemical environment to which it is exposed.

In accordance with the present invention, the HTCVD reaction product is deposited directly on the artificial substrate. As such, dense adherent coatings are deposited on the artificial substrate.

By forming dense adherent coatings on the artificial substrate, the production of fine particulates (dust) is avoided. In one embodiment, a EGR is oriented vertically (for example, by rotating EGR 30a in FIG. 2 clockwise by 90° so that plates 42 are vertical). In this manner, a region 120 (FIG. 2) captures any material which flakes off of the artificial substrate. (Any flakes which are produced typically are relatively large and heavy and thus are readily captured as compared to the dust generated by some conventional techniques.)

Further, by forming dense adherent coatings on the artificial substrate, the tendency of impurities trapped in the deposited coating to be leachable is reduced (for example, when a EGR is removed from service and placed in a landfill). Depending upon the particular process and exhaust gas treated, this may result in the decommissioned EGR (and the HTCVD reaction product contained therein) to be classified as a low hazard waste, for example as non-hazardous waste. This is particularly advantageous since the cost and long term liability associated with the disposal of hazardous waste can be significant. Further, since the exhaust gas reaction byproducts often contain materials which can be readily recycled (depending upon the particular process and exhaust gas treated), the decommissioned EGR and/or removed materials can possibly be sent to a recycler.

Generally, the EGR is decommissioned when the HTCVD reaction product significantly obstructs the flow of the exhaust gas through the EGR. Decommissioning typically involves taking the EGR off-line, removing the artificial substrate and removing any deposits remaining within the outer housing. A new artificial substrate is installed and the EGR is brought back on-line. Since the EGR is located after vacuum pump 22 (FIG. 1) and the flow of exhaust gas can easily be diverted, servicing the EGR has minimal effect on chamber 14.

In one embodiment, the amount of deposits on the artificial substrate is measured by passing an electrical current through the artificial substrate while monitoring the temperature of the artificial substrate. In this embodiment, the artificial substrate is heated only by an electric current passing through the artificial substrate. Due to the resistance of the artificial substrate, the electrical current heats the artificial substrate.

By measuring the change in temperature of the artificial substrate for a given electrical current, the change in resistance of the artificial substrate can be measured. For example, when an electrical conductor such as tungsten is deposited on the artificial substrate, the resistance of the artificial substrate is reduced. For a fixed amount of electrical current through the artificial substrate, any reduction in resistance correspondingly reduces the temperature of the artificial substrate. This reduction in temperature can be measured, for example, by locating a thermocouple on the artificial substrate, and the amount of material deposited on the substrate can be calculated. Alternatively, the reduction in the resistance of the artificial substrate is measured directly, and the amount of material deposited on the substrate is correspondingly calculated.

In the case where the deposited material is a dielectric, the amount of deposits on the artificial substrate can again be measured by passing an electrical current through the artificial substrate while monitoring the temperature of the artificial substrate. In this embodiment, the artificial substrate is heated only by an electrical current passing through the artificial substrate. The temperature of the artificial substrate for a given current increases as the amount of dielectric deposited on the artificial substrate increases because the dielectric material acts as a thermal insulator. This increase in temperature is measured and the amount of dielectric material deposited on the artificial substrate is then calculated.

Figure 9:
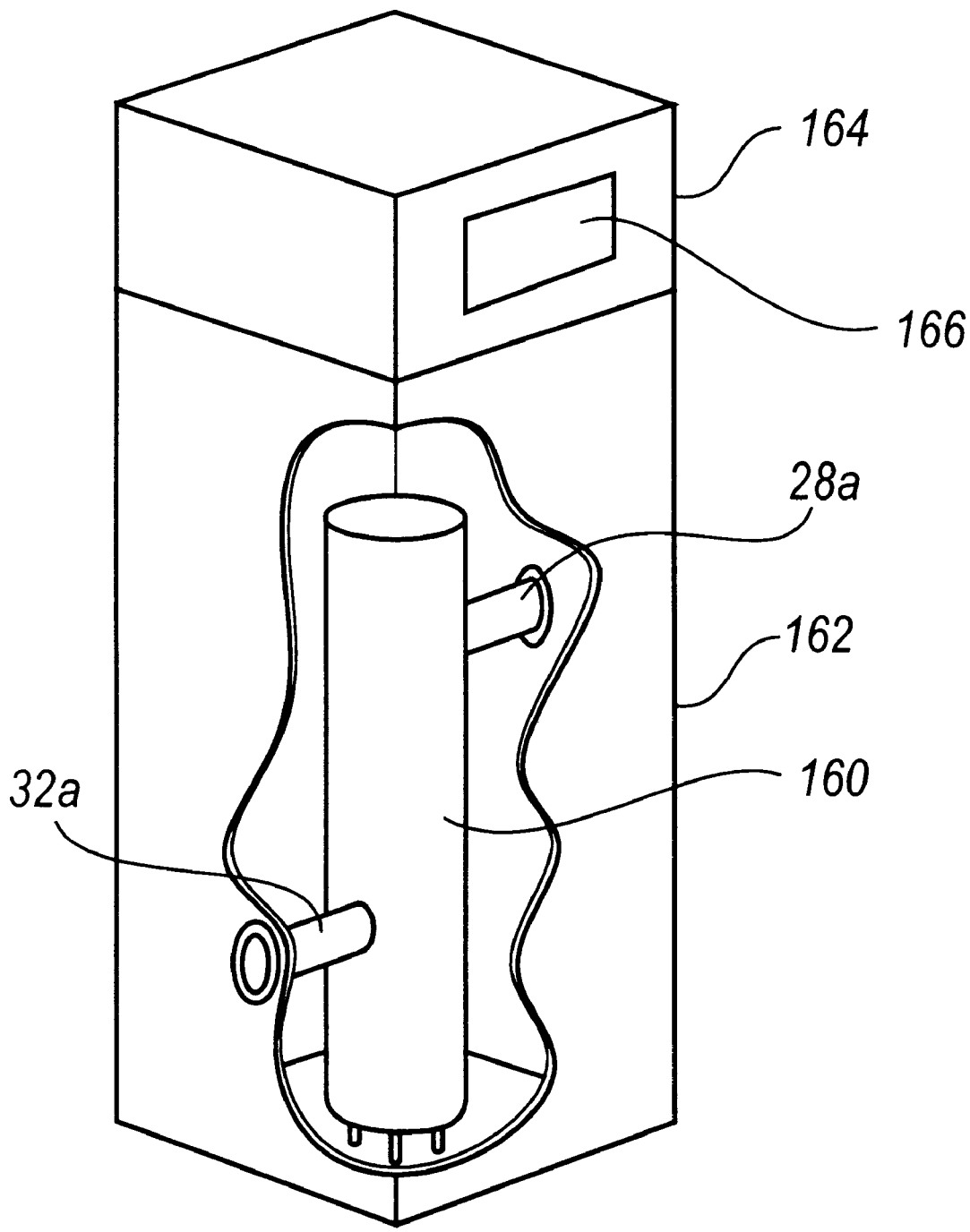
FIG. 9 is a perspective view partially cut away of an exhaust gas reactor mounted in a cabinet which includes a system controller in accordance with one embodiment of the present invention.

FIG. 9 is a perspective view partially cut away of an EGR mounted in a cabinet which includes a system controller in accordance with one embodiment of the present invention. As shown in FIG. 9, an EGR 160 is enclosed within a cabinet 162. Cabinet 162 is a substantially airtight cabinet which forms a secondary containment around EGR 160 to contain any exhaust gas which escapes from EGR 160. Typically, cabinet 162 is fitted with a vent (not shown) to vent any escaped exhaust gas to the atmosphere. Further, cabinet 162 can be fed a purge gas, such as air or nitrogen, to purge any escaped exhaust gas from cabinet 162.

Located in the top section of cabinet 162 is a system controller 164 which monitors and controls EGR 160. System controller 164 measures the temperature (using thermocouples) of EGR 160. System controller 164 accordingly adjusts the temperature(s) of heater jacket 44 and/or resistive heating element 90 (FIG. 6) to maintain the temperature of EGR 160 at the desired setpoint temperature.

In one embodiment, system controller 164 monitors the pressure at inlet port 28a of EGR 160, for example through a pressure transducer mounted to inlet port 28a. As HTCVD reaction product is deposited in EGR 160, the flow of exhaust gas through EGR 160 is impeded. This results in a pressure rise at inlet port 28a. When the pressure at inlet port 28a reaches a setpoint pressure, for example 780 torr, system controller 164 activates a bypass system (not shown). The bypass system diverts exhaust gas from EGR 160, for example diverts the exhaust gas directly to the atmosphere or to a redundant scrubber or dilution tube.

In another embodiment, system controller 164 activates the bypass system when the pressure change from inlet port 28a to outlet port 32a reaches a setpoint pressure change, for example 30 torr. This pressure change can be measured, for example, through pressure transducers mounted to inlet port 28a and outlet port 32a.

In one embodiment, system controller 164 includes a display 166. This enables system controller 164 to display various conditions, such as the temperature and pressure, of EGR 160. Alternatively, controller 164 outputs the information directly to another electronic unit, for example to a central controller which controls the entire semiconductor process. Although system controller 164 is shown as integral to cabinet 162, it is understood that system controller 164 can be remote from cabinet 162.

Figure 10:
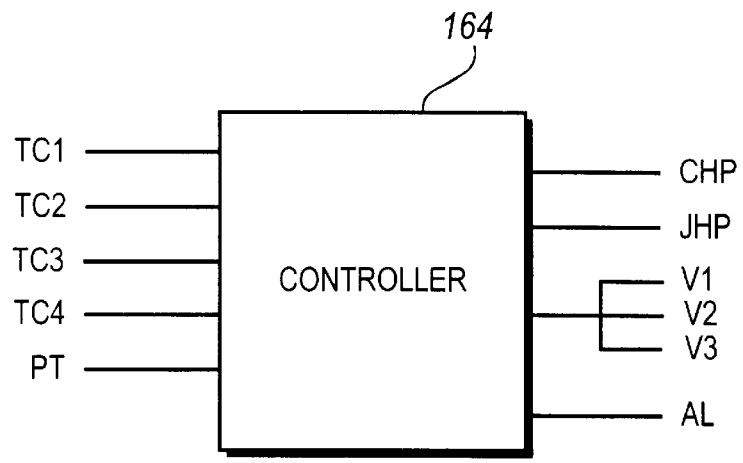
FIG. 10 is a block diagram of a controller used to control the exhaust gas reactor.
Figure 11:
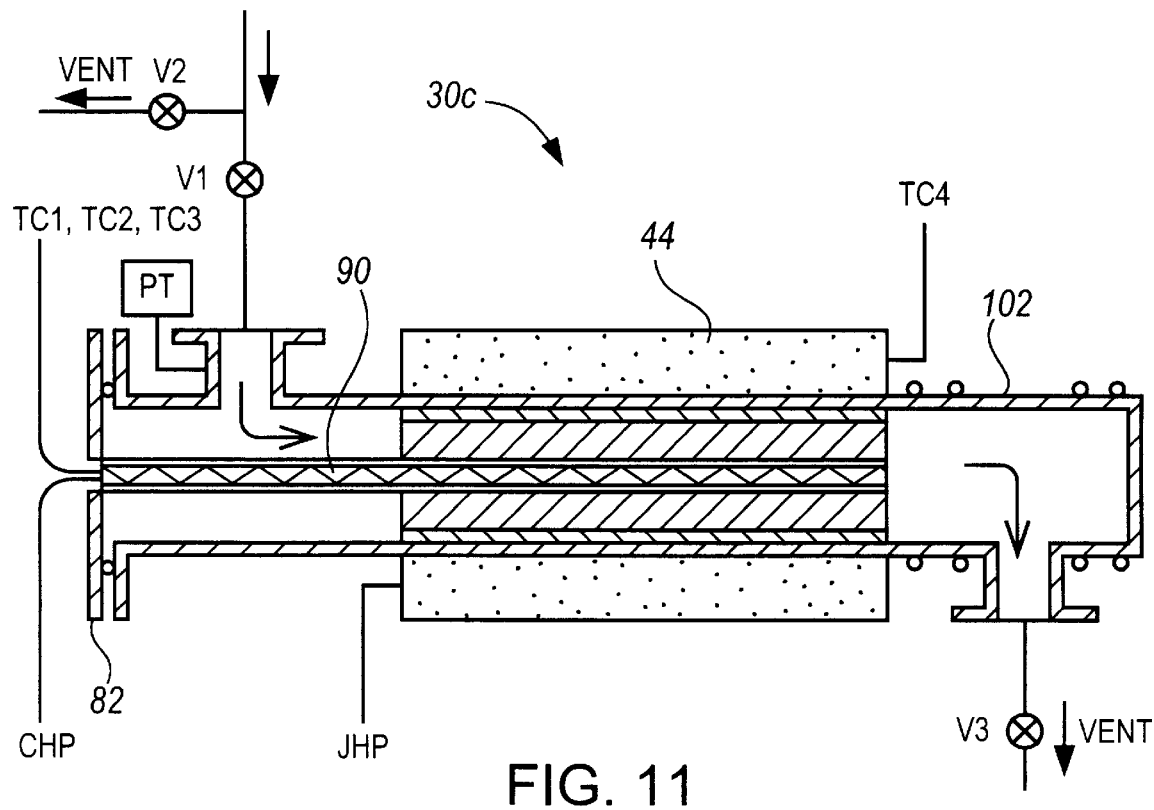
FIG. 11 is a cross-sectional view of an exhaust gas reactor showing the locations of various valves, thermocouples and transducers.

FIGS. 10 and 11 illustrate how controller 164 (which may be an Anafaze MLS 16 programmable controller) is connected to the heaters, valves and transducers on EGR 30c. FIG. 10 shows a block diagram of controller 164 having various inputs and outputs. FIG. 11 shows the heaters, valves and transducers associated with EGR 30c. As indicated, controller 164 receives input signals from three thermocouples TC1, TC2 and TC3, which detect the temperature in the top, center and bottom zones, respectively, of resistive heating element 90, and a thermocouple TC4, which detects the temperature in the jacket heater 44. Controller 164 also receives an input signal from a pressure tranducer PT which monitors the pressure at the inlet port 28a. Controller 164 uses the input signals to generate outputs which regulate valves V1 and V2 upstream of EGR 30c and valve V3 downstream of EGR 30c. Closing valve V1 and opening valve V2, for example, causes EGR 30c to be bypassed. Other outputs CHP, JHP regulate the power flow to the resistive heating element 90 and the jacket heater 44, respectively. Another output AL activates an alarm (not shown) in the event of a malfunction—for example, an excessive increase in the pressure detected by pressure transducer PT.

Referring back to FIG. 1, EGR 30 is located downstream from vacuum pump 22. However, in an alternative embodiment, EGR 30 is located upstream from vacuum pump 22, i.e. is located between outlet port 16 of chamber 14 and inlet port 20 of vacuum pump 22. For example, it may be desirable to locate EGR 30 upstream to reduce the volume of exhaust gas through EGR 30 (vacuum pump 22 is often fed ballast nitrogen which mixes with the exhaust gas and increases the total volume of exhaust gas which exits vacuum pump 22).

By locating EGR 30 upstream from vacuum pump 22, the pressure within EGR 30 is reduced to below atmospheric pressure. Typically, as the pressure within EGR 30 is reduced, the temperature to which the artificial substrate must be heated to effectively treat the exhaust gas is increased.

In an alternative embodiment, an exhaust gas cooler is located downstream of the EGR. Referring to FIG. 1, an exhaust gas cooler 122 cools exhaust gas is charged from EGR 30 at outlet port 32 before the exhaust gas is discharged to the atmosphere. For example, it may be desirable to cool the exhaust gas thereby eliminating the necessity of insulating conduit 34 through which the exhaust gas flows to the atmosphere. The exhaust gas can be cooled, for example, by a conventional water cooled heat exchanger. Although exhaust gas cooler 122 in FIG. 1 is shown as a separate unit, it is understood that exhaust gas cooler 122 can be mounted directly to the output port 32 of EGR 30.

Alternatively, the exhaust gas cooler can be integral with the EGR. Referring to FIG. 6, by wrapping a water cooled coil 119 around section C of exhaust gas reactor 30c, the exhaust gas is cooled before it exits outlet port 32a.

In an alternative embodiment, supplemental process gases are injected into EGR 30 (FIG. 1) and mixed with the exhaust gas to improve the efficiency of EGR 30 or to modify the chemical composition of the HTCVD reaction product deposited. For example, when $WF_6$ is the active gas species, oxygen, ammonia or methane could be injected into EGR 30 to form tungsten trioxide, tungsten nitride or tungsten carbide, respectively, instead of elemental tungsten.

In alternative embodiments, instead of treating an exhaust gas containing $WF_6$, other inorganic containing gases are treated. For example, gases containing lithium, silicon, potassium, rubidium, cesium, strontium, barium, scandium, yttrium, lanthanium, cerium, praeseodymium, neodymium, samarium, europium, gadolinium, terbium, dysprosium, holmium, erbium, thulium, ytterbium, lutetium, vanadium, manganese, rhenium, iron, osmium, cobalt, tridium, palladium, copper, gold, zinc, cadmium, mercury, boron, aluminum, gallium, zudium, thallium, carbon, lead, nitrogen, antimony, bismuth, oxygen, sulfur, selenium, tellurium, germanium, tin, boron, aluminum, gallium, indium, phosphorus, arsenic, copper, nickel, platinum, tungsten, molybdenum, chromium, tantalum, niobium, titanium, zirconium, hafnium, magnesium, beryllium, calcium, silver, ruthenium, rhodium are treated. Generally, any exhaust gas which contains active gas species whose compounds can be deposited thermally can be treated.

Referring to FIG. 1, in an alternative embodiment an additional high temperature (HT) reactor 130 located downstream from EGR 30 is installed. HT reactor 130 is substantially similar in structure to EGR 30. However, the temperature in HT reactor 130 is relatively high as compared to EGR 30, and is generally greater than 900° C. The relatively high temperature in HT reactor 130 is sufficient to decompose perfluorocarbons (PFCs). Although HT reactor 130 includes a heated structure similar to the artificial substrate in EGR 30, the heated structure is used to decompose PFC and is typically not used as a substrate upon which HTCVD reaction product is deposited. As such, the heated structure within HT reactor 130 is not referred to as an artificial substrate.

Although the present invention has been described with reference to preferred embodiments, persons skilled in the art will recognize that changes may be made in form and detail without departing from the spirit and scope of the invention. For example, although specific numbers of plates are set forth in various embodiments, it is understood that other EGRs can be designed with more or less plates. Also, although the outer housing is described as circular in cross-section, it is understood that the outer housing can have other shapes, for example can be rectangular in cross-section. Further, although the inlet and outlet ports are shown as having a particular orientation and design, it is understood that the inlet and outlet ports can have other orientations and designs. It is also understood that the vacuum connections between various components can be made using a variety of conventional techniques and that the temperature of an EGR can be measured at a variety of locations, for example by using thermocouples.

Moreover, while this invention is advantageously applied to semiconductor processing, it is clear that this invention is also applicable to any CVD, PECVD plasma etch or similar process used in industries other than the semiconductor industry. For example, the deposition of optical coatings for architectural use is increasingly being accomplished by CVD or PECVD processes. In addition, many other industrial processes generate waste streams containing gaseous compounds of the elements listed above; this invention can be used with any such process.

I claim:

1. An exhaust gas reactor comprising:
   an outer housing having an inlet port and an outlet port;
   an artificial substrate located within said outer housing said artificial substrate comprising:
   a first tube;
   a second tube; and
   a plurality of plates radiating from said first tube to said second tube; and
   means for heating said artificial substrate.

2. The exhaust gas reactor of claim 1 wherein said means for heating heats said artificial substrate to a temperature of at least 350° C.

3. The exhaust gas reactor of claim 1 wherein said means for heating comprises means for inductively coupling radio frequency or microwave energy to said artificial substrate.

4. The exhaust gas reactor of claim 1 wherein said means for heating comprises means for passing an electrical current through said artificial substrate.

5. The exhaust gas reactor of claim 1 further comprising means for measuring the temperature of said artificial substrate.

6. The exhaust gas reactor of claim 5 wherein said means for measuring comprises a thermocouple.

7. The exhaust gas reactor of claim 1 wherein said outer housing is a sealed metal tube.

8. The exhaust gas reactor of claim 1 wherein said means for heating comprises an electrically heated jacket located on an outside surface of said outer housing.

9. The exhaust gas reactor of claim 1 wherein said means for heating comprises a resistive heating element located in said first tube.

10. The exhaust gas reactor of claim 1 wherein said first tube has a first end and a second end, said first end being attached to a face plate, said second end being sealed.

11. The exhaust gas reactor of claim 10 wherein said outer housing has a flanged first end which is in contact with said face plate.

12. The exhaust gas reactor of claim 10 wherein said reactor is mounted vertically such that said face plate is directed upward.

13. The exhaust gas reactor of claim 1 wherein an angle between adjacent plates of said plurality of plates is 15°.

14. The exhaust gas reactor of claim 1 wherein said second tube has an outer diameter less than an inner diameter of said outer housing.

15. The exhaust gas reactor of claim 14 wherein said outer diameter of said second tube is six millimeters smaller than said inner diameter of said outer housing.

16. The exhaust gas reactor of claim 1 wherein said inlet port of said outer housing is coupled to a CVD, PECVD or plasma etch chamber.

17. The exhaust gas reactor of claim 16 wherein a vacuum pump is located between said inlet port of said outer housing and said chamber.

18. The exhaust gas reactor of claim 1 wherein said outlet port of said outer housing is coupled to an exhaust gas cooler.

19. The exhaust gas reactor of claim 1 wherein a portion of said outer housing located adjacent said output port and after said artificial substrate is cooled.

20. The exhaust gas reactor of claim 1 further comprising a first means for measuring pressure mounted to said inlet port.

21. The exhaust gas reactor of claim 20 further comprising a second means for measuring pressure mounted to said outlet port.

22. The exhaust gas reactor of claim 1 further comprising a system controller adapted to control the temperature of said exhaust gas reactor.

23. The exhaust gas reactor of claim 22 wherein said system controller is adapted to monitor the pressure of said exhaust gas reactor.

24. The exhaust gas reactor of claim 1 wherein said exhaust gas reactor is located in a substantially airtight cabinet.

25. The exhaust gas reactor of claim 24 wherein said substantially airtight cabinet is fitted with a vent.

26. The exhaust gas reactor of claim 24 wherein said substantially airtight cabinet is connected to a source of purge gas.

27. The exhaust gas reactor of claim 1 wherein said outlet port of said outer housing is coupled to a high temperature exhaust gas reactor.

28. A semiconductor processing system comprising:
   a CVD, PECVD or plasma etch processing chamber; and
   the exhaust gas reactor of claim 1.

29. The semiconductor processing system of claim 28 wherein said semiconductor processing chamber is a plasma enhanced chemical vapor deposition (PECVD) chamber.

30. The semiconductor processing system of claim 28 wherein said semiconductor processing chamber is a chemical vapor deposition (CVD) chamber.

31. A method of removing active gas species from a semiconductor process exhaust gas comprising:
   heating an artificial substrate; and
   contacting said exhaust gas with said artificial substrate, wherein said exhaust gas is at a pressure greater than or equal to atmospheric pressure.

32. The method of claim 31 wherein said artificial substrate is contained within an outer housing, said heating further comprising heating an outer surface of said outer housing.

33. The method of claim 31 wherein said contacting further comprises depositing involatile high temperature chemical vapor deposition (HTCVD) reaction product on said artificial substrate.

34. The method of claim 33 wherein the distribution of said involatile HTCVD reaction product on said artificial substrate is controlled by controlling the temperature to which said artificial substrate is heated during said heating.

35. The method of claim 33 further comprising capturing any of said involatile HTCVD reaction product which flakes off of said artificial substrate.

36. The method of claim 31 wherein said active gas species is tungsten hexafluoride ($WF_6$) and wherein said heating comprises heating said artificial substrate to a temperature of at least 350° C.

37. The method of claim 31 wherein said heating comprises coupling radio frequency or microwave radiation to said artificial substrate.

38. The method of claim 31 wherein said heating comprises passing an electrical current through said artificial substrate.

39. The method of claim 38 further comprising measuring the temperature of said artificial substrate.

40. The method of claim 31 further comprising cooling said exhaust gas subsequent to said contacting.

41. The method of claim 31 further comprising mixing said exhaust gas with supplemental process gases.

42. The method of claim 41 wherein said supplemental process gasses are selected from the group consisting of oxygen, ammonia, and methane.

43. The method of claim 31 further comprising contacting said exhaust gas with a heated structure heated to a temperature greater than the temperature of said artificial substrate.

44. The method of claim 43 wherein said heated structure is heated to a temperature sufficient to decompose perfluorocarbons.

45. The method of claim 44 wherein said heated structure is heated to greater than 900° C.

46. The method of claim 31 wherein said artificial substrate is contained within an outer housing, said method further comprising monitoring the pressure of an inlet port of said outer housing.

47. The method of claim 46 further comprising diverting said exhaust gas from said artificial substrate when said pressure at said inlet port exceeds a setpoint pressure.

48. The method of claim 46 further comprising:
   monitoring the pressure at an outlet port of said outer housing; and
   diverting said exhaust gas from said artificial substrate when a pressure difference between said outlet port pressure and said inlet port pressure exceeds a setpoint pressure difference.

49. The method of claim 31 further comprising controlling the temperature to which said artificial substrate is heated.

50. A method of removing active gas species from a semiconductor process exhaust gas comprising:
   heating an artificial substrate, wherein said artificial substrate comprises a plurality of plates radiating from a central tube, said heating further comprising heating said central tube; and
   contacting said exhaust gas with said artificial substrate.

51. The method of claim 50 wherein said exhaust gas is at a pressure below atmospheric pressure during said step of contacting.

* * * * *